United States Patent
Taya

(10) Patent No.: US 11,386,848 B2
(45) Date of Patent: Jul. 12, 2022

(54) SHIFT REGISTER, DISPLAY DEVICE, AND METHOD FOR CONTROLLING SHIFT REGISTER

(71) Applicant: SHARP KABUSHIKI KAISHA, Sakai (JP)

(72) Inventor: Nobuyuki Taya, Osaka (JP)

(73) Assignee: SHARP KABUSHIKI KAISHA, Sakai (JP)

( * ) Notice: Subject to any disclaimer, the term of this patent is extended or adjusted under 35 U.S.C. 154(b) by 0 days.

(21) Appl. No.: 17/296,531

(22) PCT Filed: Dec. 5, 2018

(86) PCT No.: PCT/JP2018/044749
§ 371 (c)(1),
(2) Date: May 24, 2021

(87) PCT Pub. No.: WO2020/115841
PCT Pub. Date: Jun. 11, 2020

(65) Prior Publication Data
US 2022/0028342 A1    Jan. 27, 2022

(51) Int. Cl.
G09G 3/3266    (2016.01)
G09G 3/36    (2006.01)
G11C 19/28    (2006.01)
H03K 3/356    (2006.01)
H03K 3/3562    (2006.01)

(52) U.S. Cl.
CPC ......... *G09G 3/3266* (2013.01); *G09G 3/3677* (2013.01); *G11C 19/28* (2013.01); *H03K 3/35625* (2013.01); *H03K 3/356008* (2013.01); *G09G 2310/0286* (2013.01)

(58) Field of Classification Search
CPC ............... G09G 3/3266; G09G 3/3677; G09G 2310/0286; H03K 3/356008; H03K 3/35625
See application file for complete search history.

(56) References Cited

U.S. PATENT DOCUMENTS

| | | | |
|---|---|---|---|
| 6,204,703 B1 * | 3/2001 | Kwon | ............... H03K 3/356008 327/143 |
| 2003/0214337 A1 | 11/2003 | Miyagi | |
| 2011/0069805 A1 * | 3/2011 | Koyama | ............... H01L 27/124 377/2 |

FOREIGN PATENT DOCUMENTS

JP    2003-332892 A    11/2003

* cited by examiner

*Primary Examiner* — Patrick O Neill
(74) *Attorney, Agent, or Firm* — ScienBiziP, P.C.

(57) ABSTRACT

As a scanning line drive circuit of a display device, a shift register having a configuration in which a plurality of unit circuits are connected to each other in multiple stages is used. The unit circuits each include: a plurality of control transistors; an internal node connected to a terminal of one of the plurality of control transistors; and a depletion mode initialization transistor having a first conduction terminal connected directly or through a resistor to the internal node, a second conduction terminal, and a control terminal. One of a power supply voltage and a ground voltage is applied to the second conduction terminal, and the other voltage is applied to the control terminal. The initialization transistor is turned on in a power-off state.

20 Claims, 14 Drawing Sheets

FIG. 17
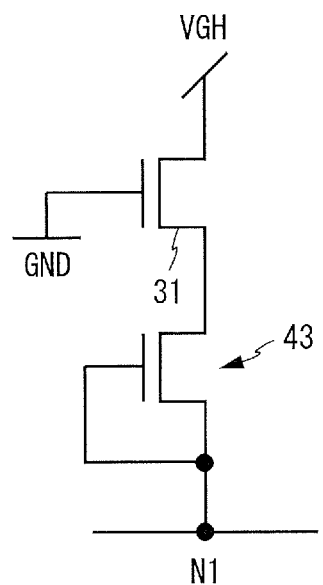
FIG. 18
(a) 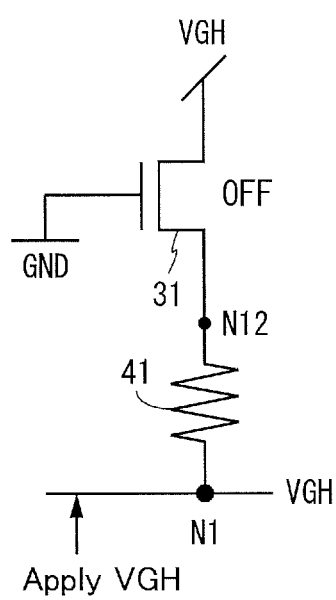   (b) 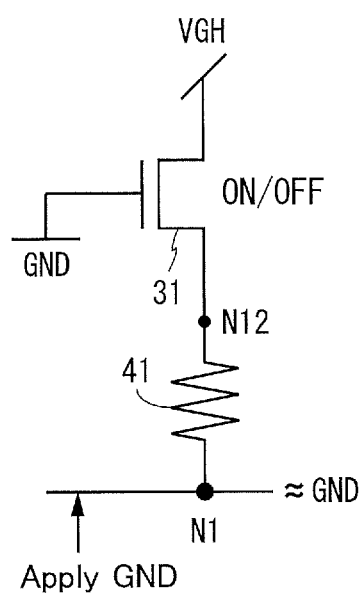   (c) 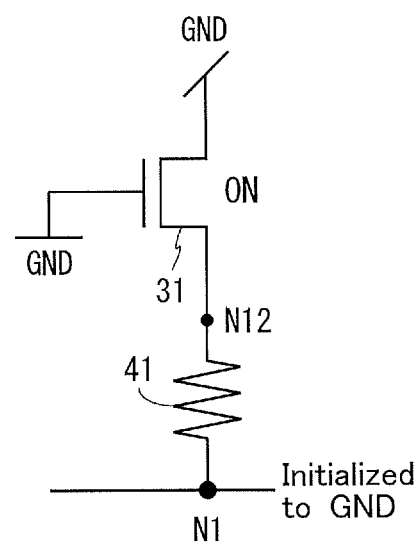

*FIG. 19*
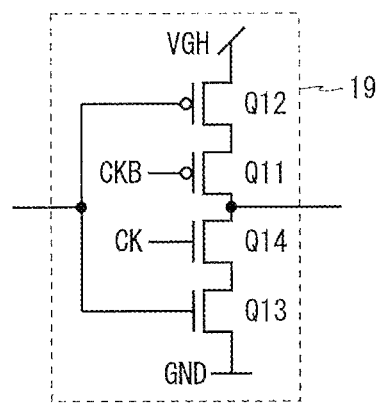
*FIG. 20* --Related Art--
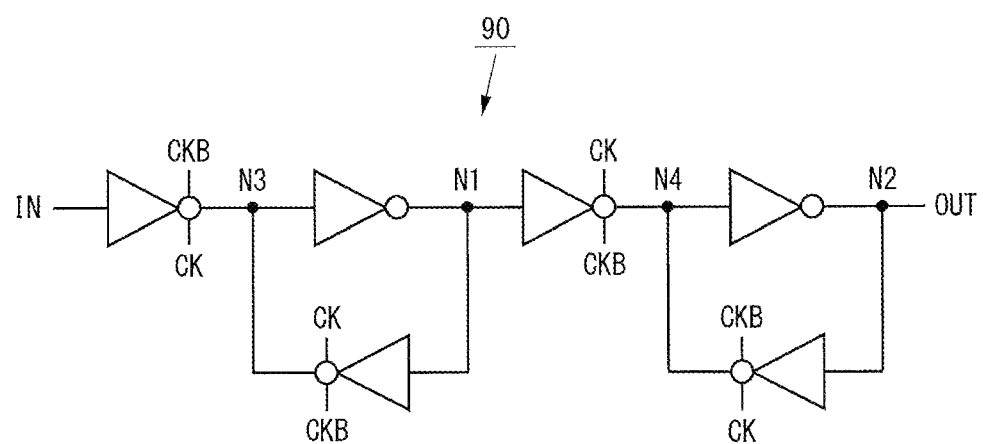

SHIFT REGISTER, DISPLAY DEVICE, AND METHOD FOR CONTROLLING SHIFT REGISTER

TECHNICAL FIELD

The disclosure relates to a shift register having a configuration in which a plurality of unit circuits are connected to each other in multiple stages, and a display device including the shift register.

BACKGROUND ART

An organic electroluminescence (hereinafter, referred to as EL) display device is widely used as a thin, lightweight, and high image quality display device. A typical organic EL display device includes an organic EL panel, a scanning line drive circuit, a data line drive circuit, and a light-emission control line drive circuit. For the scanning line drive circuit and the light-emission control line drive circuit, a shift register having a configuration in which a plurality of unit circuits are connected to each other in multiple stages is used.

For the unit circuits of the shift register, various types of circuits are known. FIG. 20 is a circuit diagram of a semi-static unit circuit. A unit circuit 90 shown in FIG. 20 includes four clocked inverters and two inverters. By connecting a plurality of unit circuits 90 to each other in multiple stages, a shift register can be formed that is used as the scanning line drive circuit and light-emission control line drive circuit of the organic EL display device.

In relation to the disclosure, Patent Document 1 describes a latch circuit having an output to which a depletion mode metal-insulator-semiconductor (MIS) transistor is connected as a pull-down element so as to securely start an RS latch in a reset state.

CITATION LIST

Patent Document

[Patent Document 1] Japanese Laid-Open Patent Publication No. 2003-332892

SUMMARY

Technical Problem

For the shift register included in the display device, it is preferred to initialize internal nodes in the unit circuits before the display device starts operation. The reason therefor is that when the display device starts operation without initializing the internal nodes, the scanning line drive circuit or the light-emission control line drive circuit may erroneously operate and an image may not be able to be normally displayed. For example, in the unit circuit 90 shown in FIG. 20, it is preferred to initialize nodes N1 and N2 or initialize nodes N3 and N4.

In a known shift register, initialization wiring lines are provided to initialize internal nodes in unit circuits (see FIGS. 8 and 9 which will be described later), and after power on, an initialization voltage is applied to the initialization wiring lines before a display device starts operation. Hence, the known shift register has the following problems: an input terminal for the initialization signal needs to be provided on a display panel; the display panel increases in size for the initialization wiring lines; and initialization needs to be performed taking a predetermined amount of time after power on.

Therefore, it is a problem to provide a shift register that can easily initialize internal nodes in unit circuits, and a display device including the shift register.

Means for Solving the Problems

The above problem can be solved for example by a shift register having a configuration in which a plurality of unit circuits are connected to each other in multiple stages, the unit circuits each including: a plurality of control transistors; an internal node connected to a terminal of one of the plurality of control transistors; and a depletion mode initialization transistor having a first conduction terminal connected directly or through a resistor to the internal node, a second conduction terminal, and a control terminal, one of a power supply voltage and a ground voltage being applied to the second conduction terminal, another one of the power supply voltage and the ground voltage being applied to the control terminal, and the initialization transistor being turned on in a power-off state.

The above problem can be also solved for example by a display device including: a display panel including a plurality of scanning lines, a plurality of data lines, and a plurality of pixel circuits; a scanning line drive circuit configured to drive the scanning lines; a data line drive circuit configured to drive the data lines; and the above-described shift register.

The above problem can be also solved for example by a method for controlling a shift register having a configuration in which a plurality of unit circuits are connected to each other in multiple stages, the method including, when the unit circuits each include: a plurality of control transistors; an internal node connected to a terminal of one of the plurality of control transistors; and a depletion mode initialization transistor having a first conduction terminal connected directly or through a resistor to the internal node, a second conduction terminal, and a control terminal, the steps of: allowing the shift register to operate by applying one of a power supply voltage and a ground voltage to the second conduction terminal, and applying another one of the power supply voltage and the ground voltage to the control terminal; and bringing the initialization transistor into an on state by stopping supply of the power supply voltage.

Effects of the Disclosure

According to any of the above-described shift register, display device, and method for controlling a shift register, in a power-off state, an initialization transistor is turned on, and thus, a ground voltage is provided to an internal node by the action of the initialization transistor. Thus, without using an initialization signal, the internal nodes in the unit circuits of the shift register can be easily initialized upon power off.

BRIEF DESCRIPTION OF THE DRAWINGS

FIG. 17 is a diagram illustrating an exemplary configuration of a resistor included in the unit circuit shown in FIG. 16.

FIG. 18 is a diagram for describing a method for initializing an internal node in the unit circuit shown in FIG. 16.

FIG. 19 is a circuit diagram illustrating another example of a clocked inverter included in a unit circuit.

FIG. 20 is a circuit diagram of a unit circuit of a known shift register.

DESCRIPTION OF EMBODIMENTS

Figure 1:
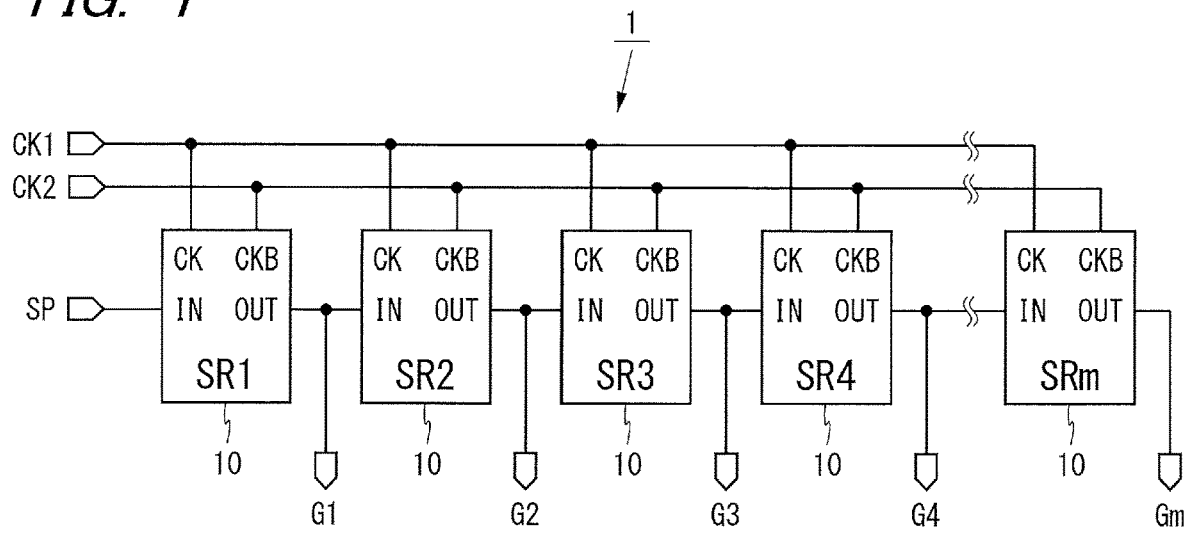
FIG. 1 is a block diagram illustrating a configuration of a shift register according to a first embodiment.

A shift register and a display device including the shift register according to each embodiment will be described below with reference to the drawings. In the following description, a signal input or output through a given terminal is referred to as the same name as the terminal. For example, a signal input through a clock terminal CK is referred to as clock signal CK. It is assumed that m and n are integers greater than or equal to 2, i is an integer between 1 and m, inclusive, and j is an integer between 1 and n, inclusive. The character string "SRi" described in the drawings represents a unit circuit in an ith stage of the shift register.

First Embodiment

FIG. 1 is a block diagram showing a configuration of a shift register according to a first embodiment. A shift register 1 shown in FIG. 1 has a configuration in which m unit circuits 10 are connected to each other in multiple stages. The unit circuits 10 each include clock terminals CK and CKB, an input terminal IN, and an output terminal OUT.

Clock signals CK1 and CK2 and a start signal SP are provided to the shift register 1 from an external source. The clock signal CK2 is a NOT signal of the clock signal CK1. The clock signal CK1 is provided to the clock terminal CK of the unit circuit 10 in each stage. The clock signal CK2 is provided to the clock terminal CKB of the unit circuit 10 in each stage. The start signal SP is provided to the input terminal IN of the unit circuit 10 in the first stage. To the input terminals IN of the unit circuits 10 in the second to mth stages are provided output signals OUT from the unit circuits 10 in the first to (m−1)th stages, respectively. An output signal OUT from a unit circuit 10 in an ith stage is output as an ith output signal Gi of the shift register 1 to an external source.

Figure 2:
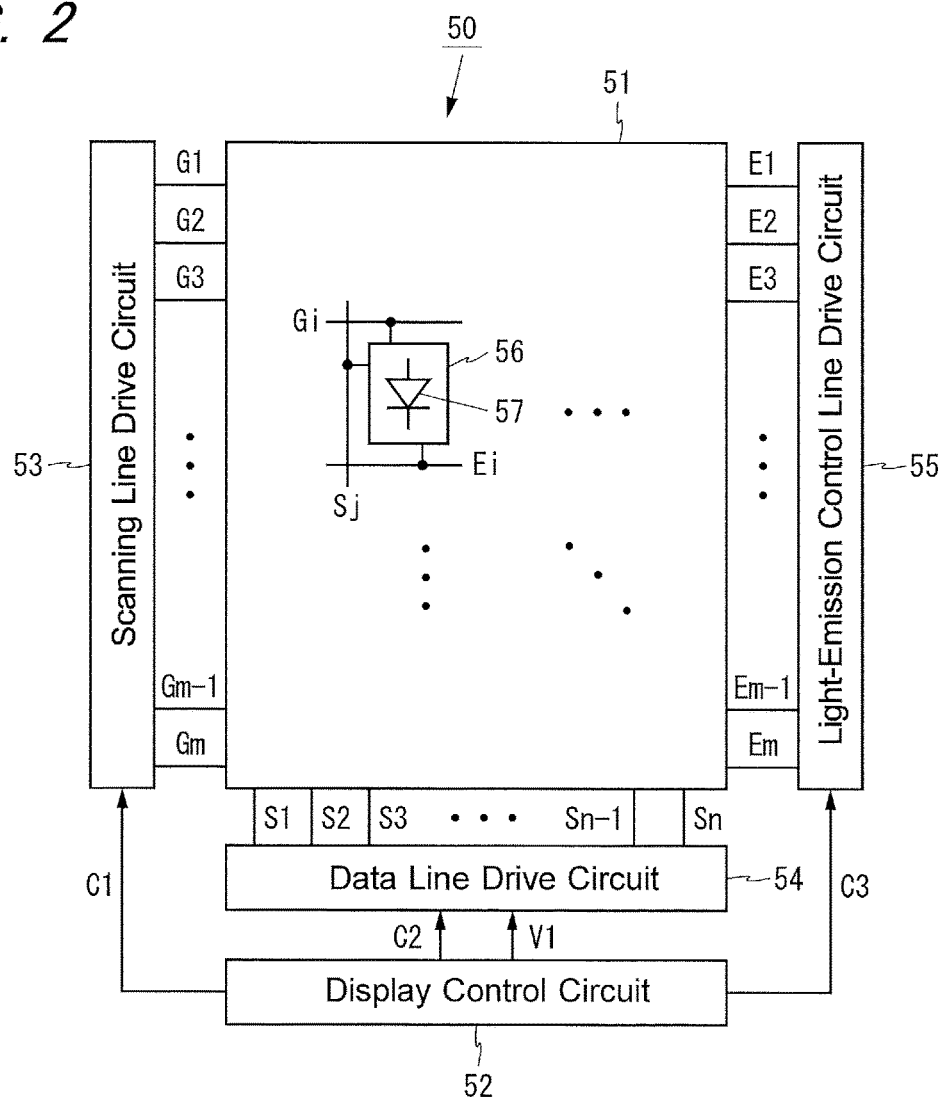
FIG. 2 is a block diagram illustrating a configuration of an organic EL display device including the shift register shown in FIG. 1.

FIG. 2 is a block diagram showing a configuration of an organic EL display device including the shift register 1. An organic EL display device 50 shown in FIG. 2 includes an organic EL panel 51, a display control circuit 52, a scanning line drive circuit 53, a data line drive circuit 54, and a light-emission control line drive circuit 55. The organic EL panel 51 includes m scanning lines G1 to Gm, n data lines S1 to Sn, m light-emission control lines E1 to Em, and (m×n) pixel circuits 56. The scanning lines G1 to Gm are arranged so as to be parallel to each other. The data lines S1 to Sn are arranged so as to be parallel to each other and orthogonal to the scanning lines G1 to Gm. The light-emission control lines E1 to Em are arranged so as to be parallel to the scanning lines G1 to Gm. The scanning lines G1 to Gm intersect the data lines S1 to Sn at (m×n) locations. The (m×n) pixel circuits 56 are arranged so as to correspond to respective intersections of the scanning lines G1 to Gm and the data lines S1 to Sn. The pixel circuits 56 each include an organic EL element 57. The organic EL element 57 functions as an electrooptic element that emits light at luminance determined based on a current. A pixel circuit 56 in an ith row and a jth column is connected to a scanning line Gi, a data line Sj, and a light-emission control line Ei.

The display control circuit 52 outputs a control signal C1 to the scanning line drive circuit 53, outputs a control signal C2 and a video signal V1 to the data line drive circuit 54, and outputs a control signal C3 to the light-emission control line drive circuit 55. The scanning line drive circuit 53 drives the scanning lines G1 to Gm based on the control signal C1. The data line drive circuit 54 drives the data lines S1 to Sn based on the control signal C2 and the video signal V1. The light-emission control line drive circuit 55 drives the light-emission control lines E1 to Em based on the control signal C3.

More specifically, the scanning line drive circuit 53 selects one scanning line in turn from among the scanning lines G1 to Gm based on the control signal C1, applies a selection voltage (e.g., a high-level voltage) to the selected scanning line, and applies a non-selection voltage (e.g., a low-level voltage) to the other scanning lines. This causes n pixel circuits 56 connected to the selected scanning line to be collectively selected. The data line drive circuit 54 applies n voltages determined based on the video signal V1 to the respective data lines S1 to Sn based on the control signal C2. Thus, the n voltages are written into the respective selected n pixel circuits 56. A current determined based on the voltage written into each pixel circuit 56 flows through the organic EL element 57, and the organic EL element 57 emits light at luminance determined based on the current flowing therethrough.

In the organic EL display device 50, the light-emission periods of the organic EL elements 57 are set on a per row of the pixel circuits 56 basis. The light-emission control line drive circuit 55 applies a light-emission voltage (e.g., a high-level voltage) to an ith light-emission control line Ei during a light-emission period of pixel circuits 56 in an ith row, and applies a non-light-emission voltage (e.g., a low-level voltage) to the ith light-emission control line Ei during other periods. For the scanning line drive circuit 53, the shift register 1 shown in FIG. 1 is used. For the light-emission control line drive circuit 55, a shift register having the same configuration as the shift register 1 is used.

Figure 3:
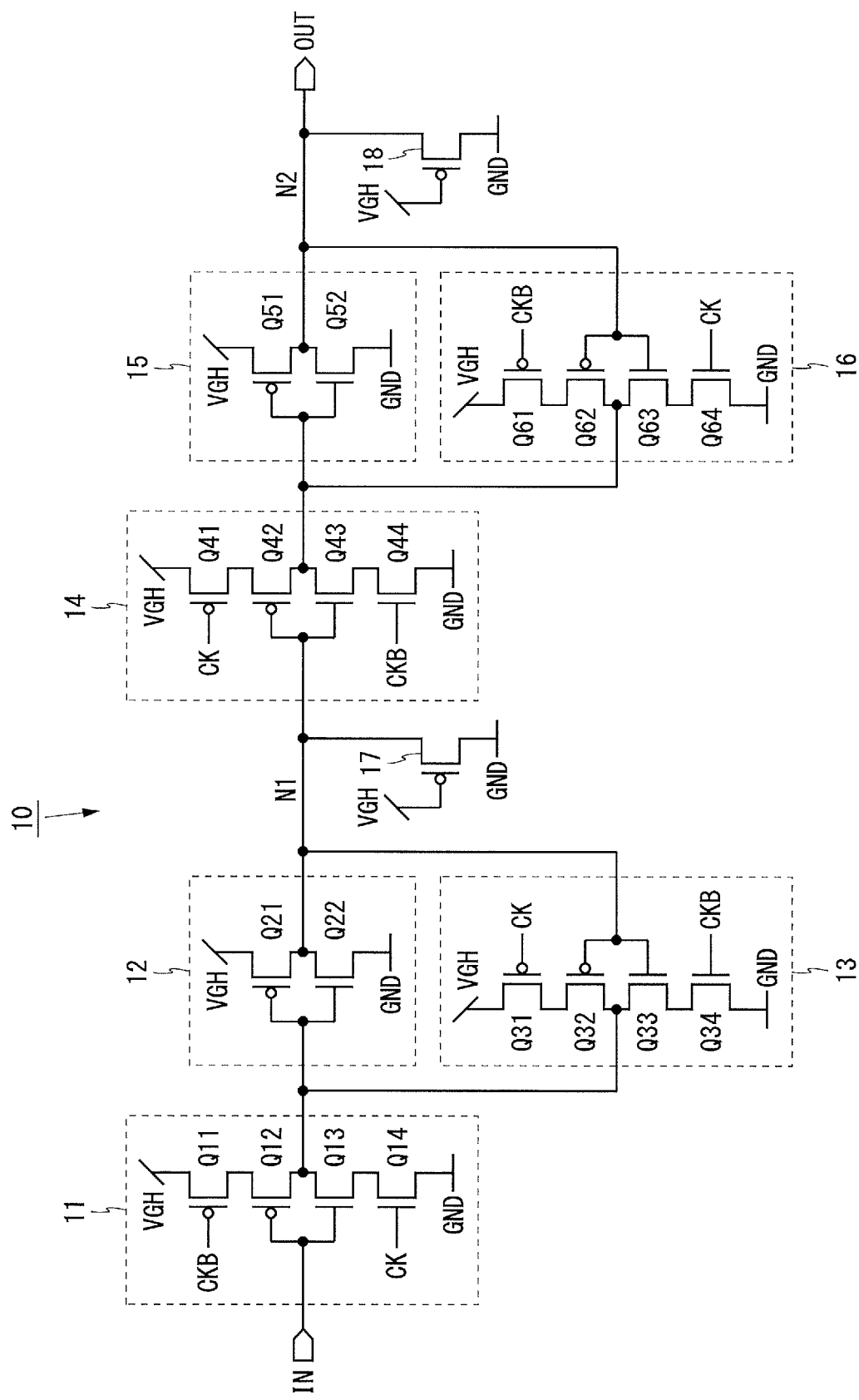
FIG. 3 is a circuit diagram of a unit circuit of the shift register shown in FIG. 1.

FIG. 3 is a circuit diagram of a unit circuit 10. The unit circuit 10 shown in FIG. 3 includes four clocked inverters 11, 13, 14, and 16, two inverters 12 and 15, and two transistors 17 and 18. The unit circuit 10 is obtained by adding the transistors 17 and 18 to the unit circuit 90 shown in FIG. 20. The transistors 17 and 18 are P-channel depletion mode transistors and function as initialization transistors. For example, a high-level power supply voltage VGH is 10 V and a low-level power supply voltage is a ground voltage GND (0 V).

P-channel transistors (including the transistors 17 and 18) included in the unit circuit 10 are formed using, for example, low temperature polycrystalline silicon (LTPS). N-channel transistors included in the unit circuit 10 are formed using, for example, LTPS or oxide semiconductors. For the oxide semiconductors, for example, indium gallium zinc oxide (IGZO) can be used.

The clocked inverter 11 includes two P-channel transistors Q11 and Q12 connected in series with each other; and two N-channel transistors Q13 and Q14 connected in series with each other. The high-level power supply voltage VGH is applied to a source terminal of the transistor Q11. A drain terminal of the transistor Q11 is connected to a source terminal of the transistor Q12. A drain terminal of the transistor Q12 is connected to a drain terminal of the transistor Q13. A source terminal of the transistor Q13 is connected to a drain terminal of the transistor Q14. The ground voltage GND is applied to the source terminal of the transistor Q14. Clock signals CKB and CK are applied to respective gate terminals of the transistors Q11 and Q14. Gate terminals of the transistors Q12 and Q13 are connected to an input terminal of the clocked inverter 11. The drain terminals of the transistors Q12 and Q13 are connected to an output terminal of the clocked inverter 11.

The inverter 12 includes a P-channel transistor Q21 and an N-channel transistor Q22 connected in series with each other. The high-level power supply voltage VGH is applied to a source terminal of the transistor Q21. A drain terminal of the transistor Q21 is connected to a drain terminal of the transistor Q22. The ground voltage GND is applied to a source terminal of the transistor Q22. Gate terminals of the transistors Q21 and Q22 are connected to an input terminal of the inverter 12. The drain terminals of the transistors Q21 and Q22 are connected to an output terminal of the inverter 12.

The clocked inverter 13 has the same configuration as the clocked inverter 11. Note, however, that the clock signals CK and CKB are provided to respective gate terminals of transistors Q31 and Q34 included in the clocked inverter 13. The clocked inverters 14 and 16 have the same configurations as the clocked inverters 13 and 11, respectively. The inverter 15 has the same configuration as the inverter 12. The transistors included in the clocked inverters 11, 13, 14, and 16 and the inverters 12 and 15 function as control transistors.

The inverters 12 and 15 output a low-level signal when an input signal is at a high level, and output a high-level signal when the input signal is at a low level. The clocked inverters 11 and 16 function as inverters when the clock signal CK is at a high level. When the clock signal CK is at a low level, the outputs of the clocked inverters 11 and 16 are in a high-impedance state. The clocked inverters 13 and 14 function as inverters when the clock signal CK is at a low level. When the clock signal CK is at a high level, the outputs of the clocked inverters 13 and 14 are in a high-impedance state.

The input terminal of the clocked inverter 11 is connected to an input terminal IN of the unit circuit 10. The output terminals of the clocked inverters 11 and 13 are connected to the input terminal of the inverter 12. The output terminal of the inverter 12 is connected to the input terminals of the clocked inverters 13 and 14. The output terminals of the clocked inverters 14 and 16 are connected to the input terminal of the inverter 15. The output terminal of the inverter 15 is connected to the input terminal of the clocked inverter 16 and the output terminal OUT of the unit circuit 10.

Nodes connected to the output terminals of the inverters 12 and 15 are hereinafter referred to as N1 and N2, respectively. Source terminals (first conduction terminals) of the transistors 17 and 18 are connected to the nodes N1 and N2, respectively. The ground voltage GND is applied to drain terminals (second conduction terminals) of the transistors 17 and 18. The high-level power supply voltage VGH is applied to gate terminals (control terminals) of the transistors 17 and 18. In the unit circuit 10, the first conduction terminals of the transistors 17 and 18 are directly connected to the nodes N1 and N2, respectively. As will be described later, in a power-on state, the transistors 17 and 18 do not affect the operation of the unit circuit 10. Thus, in the power-on state, the unit circuit 10 performs the same operation as the unit circuit 90 shown in FIG. 20.

Figure 4:
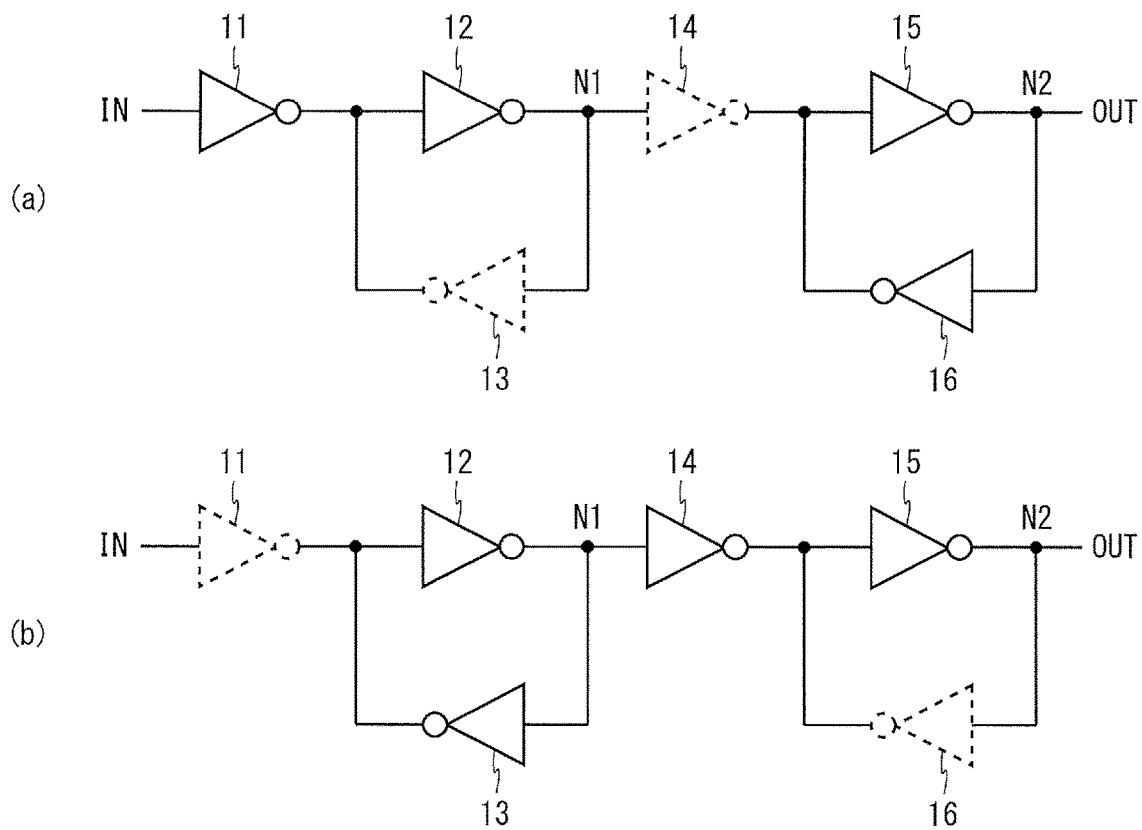
FIG. 4 is a diagram for describing the operation of the unit circuit shown in FIG. 3.

The operation of the unit circuit 10 in a power-on state will be described with reference to FIG. 4. The output of an element shown by a broken line in FIG. 4 is in a high-impedance state. As shown below, when the clock signal CK changes from a low level to a high level, the unit circuit 10 holds an input signal IN in the node N1. When the clock signal CK changes from a high level to a low level, an output signal OUT becomes equal to the signal held in the node N1.

When the clock signal CK is at a high level (FIG. 4(a)), the clocked inverters 11 and 16 function as inverters, and the outputs of the clocked inverters 13 and 14 are in a high-impedance state. At this time, the input signal IN is provided to the node N1, and a NOT signal of an input signal of the inverter 15 (equal to the signal held in the node N1) is output as an output signal OUT. Even when the input signal IN is changed while the clock signal CK is at a high level, the output signal OUT does not change.

When the clock signal CK is at a low level (FIG. 4(b)), the clocked inverters 13 and 14 function as inverters, and the outputs of the clocked inverters 11 and 16 are in a high-impedance state. At this time, the input signal IN is not provided to the node N1, and an input signal of the clocked inverter 14 (a signal held in the node N1) is output as an output signal OUT. Even when the input signal IN is changed while the clock signal CK is at a low level, the signal held in the node N1 does not change and the output signal OUT does not change, either.

Figure 5:
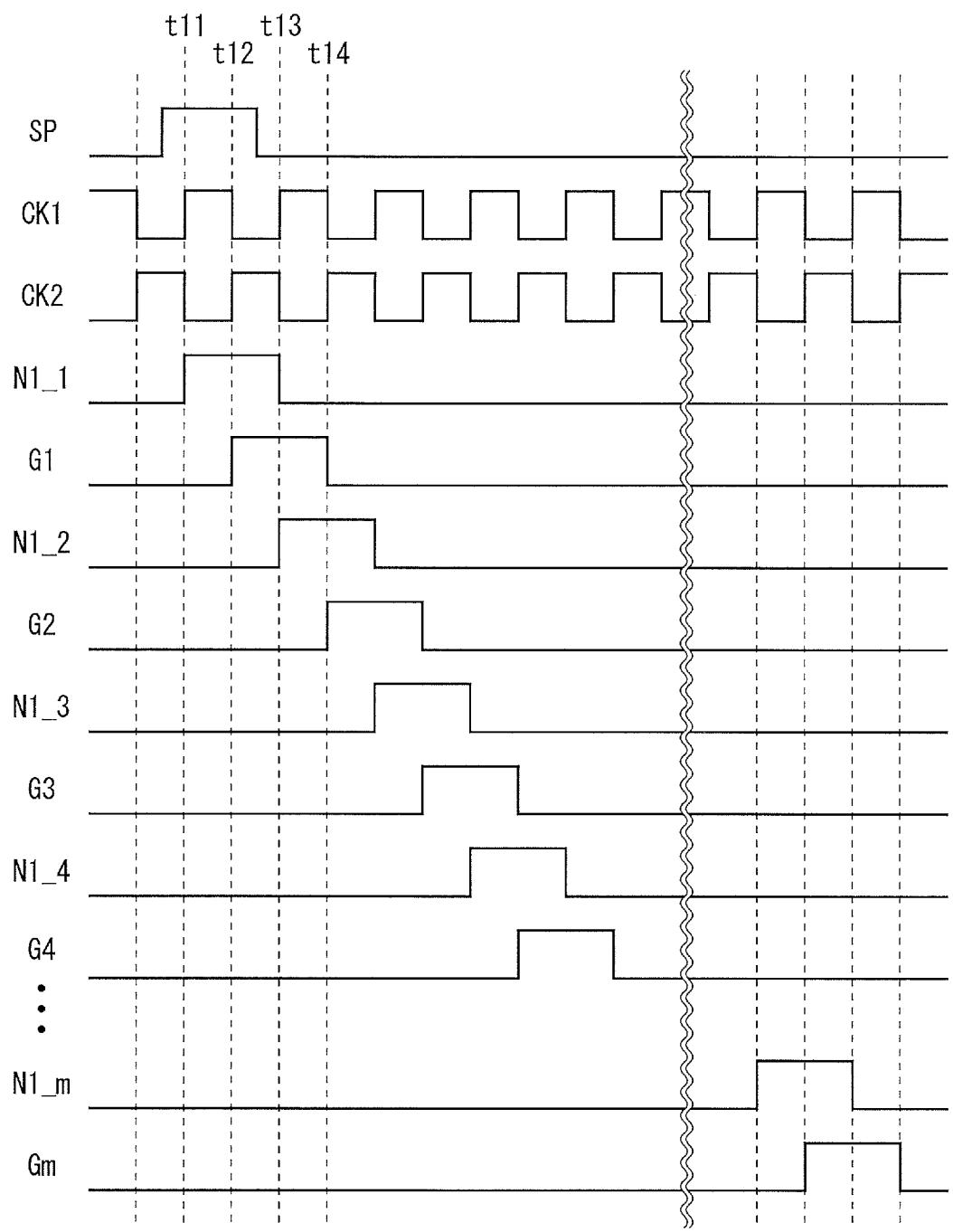
FIG. 5 is a timing chart of the shift register shown in FIG. 1.

FIG. 5 is a timing chart of the shift register 1. In FIG. 5, N1_i indicates a voltage at a node N1 in a unit circuit 10 in an ith stage. The start signal SP is at a high level only for a period corresponding to one period of the clock signal CK1. When the clock signal CK1 is changed to a high level at time t11 after the start signal SP is changed to a high level, a voltage N1_1 at a node N1 in a unit circuit 10 in the first stage changes to a high level. Then, when the clock signal CK1 is changed to a low level at time t12, an output signal G1 from the unit circuit 10 in the first stage changes to a high level. Then, when the clock signal CK1 is changed to a high level at time t13, the voltage N1_1 at the node N1 in the unit circuit 10 in the first stage changes to a low level, and a voltage N1_2 at a node N1 in a unit circuit 10 in a second stage changes to a high level. Then, when the clock signal CK1 is changed to a low level at time t14, the output signal G1 from the unit circuit 10 in the first stage changes to a low level, and an output signal G2 from the unit circuit 10 in the second stage changes to a high level. At and after time t14, the shift register 1 operates in the same manner.

The output signal G1 from the unit circuit 10 in the first stage is at a high level only for a period corresponding to one period of the clock signal CK1 after the start signal SP goes to a high level. The output signal G2 from the unit circuit 10 in the second stage is at a high level only for a period corresponding to one period of the clock signal CK1, delayed by a period corresponding to one period of the clock signal CK1 from the output signal G1 from the unit circuit 10 in the first stage. Likewise, an output signal Gi from the unit circuit 10 in the ith stage is at a high level only for a period corresponding to one period of the clock signal CK1, delayed by a period corresponding to one period of the clock signal CK1 from an output signal Gi-1 from a unit circuit 10 in an (i-1)th stage. The output signals G1 to Gm from the unit circuits 10 are at a high level in ascending order for one period of the clock signal CK1.

Figure 6:
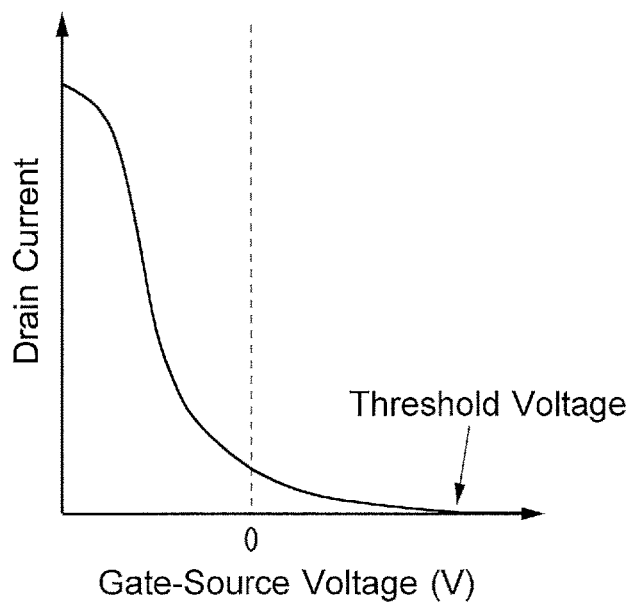
FIG. 6 is a characteristic diagram of a P-channel depletion mode transistor.

FIG. 6 is a characteristic diagram of a P-channel depletion mode transistor. As shown in FIG. 6, in the depletion mode transistor, when the gate-source voltage is 0 V, a drain current flows. The transistors 17 and 18 included in the unit circuit 10 have a characteristic shown in FIG. 6.

Figure 7:
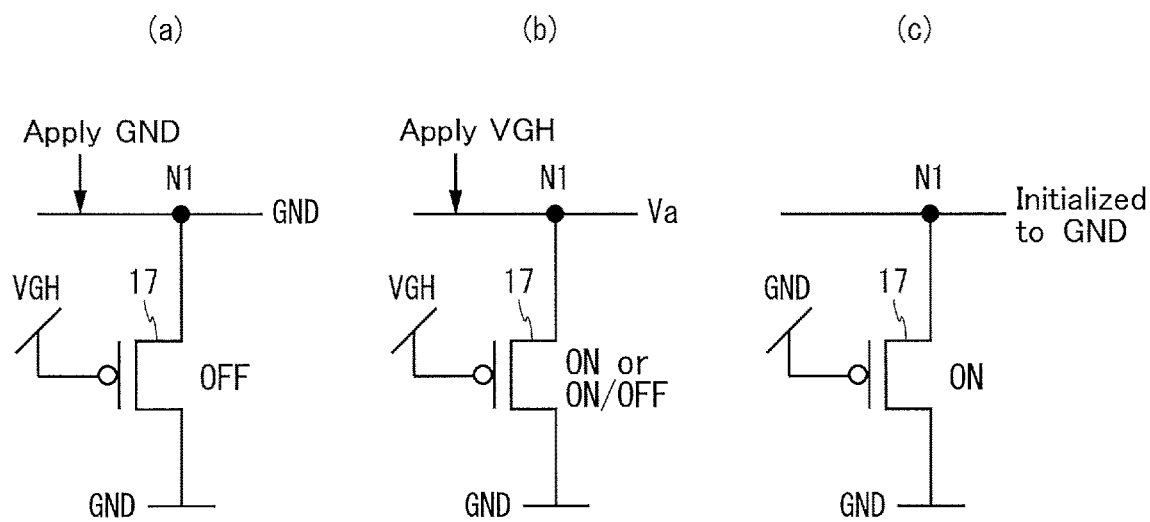
FIG. 7 is a diagram for describing a method for initializing an internal node in the unit circuit shown in FIG. 3.

FIG. 7 is a diagram for describing a method for initializing an internal node in the unit circuit 10. Here, a method for initializing a voltage at the node N1 using the transistor 17 will be described. FIG. 7(a) shows a state in which in a power-on state, the transistor Q22 (FIG. 3) is turned on and the ground voltage GND is applied to the node N1. FIG. 7(b) shows a state in which in the power-on state, the transistor Q21 (FIG. 3) is turned on and the high-level power supply voltage VGH is applied to the node N1. FIG. 7(c) shows a power-off state. In the power-on state, the high-level power supply voltage VGH is applied to the gate terminal of the transistor 17. In the power-off state, the voltage at the gate terminal of the transistor 17 is the ground voltage GND.

When the ground voltage GND is applied to the node N1 in the power-on state (FIG. 7(a)), the transistor 17 is turned off and the voltage at the node N1 is the ground voltage GND. At this time, a logic level (low level) corresponding to the voltage at the node N1 is the same as a logic level corresponding to a voltage applied to the node N1 using the transistor Q22. Thus, at this time, the transistor 17 does not affect the operation of the unit circuit 10.

A situation in which the high-level power supply voltage VGH is applied to the node N1 in the power-on state (FIG. 7(b)) is considered. Assuming that the transistor 17 is in an off state at this time, since a current passing through the transistor 17 does not flow between the node N1 and the ground, the voltage at the node N1 is the high-level power supply voltage VGH. Since the gate-source voltage of the depletion mode transistor 17 is 0 V, the transistor 17 is turned on and a current passing through the transistor 17 flows. At this time, the voltage at the node N1 is a voltage (hereinafter, referred to as Va) determined based on the ratio of the on-resistance of the transistor Q21 to the on-resistance of the transistor 17. The unit circuit 10 is designed such that a logic level corresponding to the voltage Va is a high level. Hence, the unit circuit 10 is designed, for example, such that the on-resistance of the transistor 17 is sufficiently larger than the on-resistance of the transistor Q21.

When a threshold voltage of the transistor 17 is Vthp (>0), there are a case in which Va≥VGH−Vthp and a case in which Va<VGH−Vthp (the former is hereinafter referred to as first case and the latter is hereinafter referred to as second case). In the first case, even after the voltage at the node N1 is changed to Va, the transistor 17 maintains the on state, and a current passing through the transistor 17 continues to flow. Thus, in the first case, the voltage at the node N1 does not change from Va. In the second case, when the voltage at the node N1 is changed to a voltage Vaa which is below (VGH−Vthp), the transistor 17 is turned off and the voltage at the node N1 goes back to the high-level power supply voltage VGH. Hence, the transistor 17 is turned back on and the voltage at the node N1 goes back to Vaa. Thereafter, too, the same situation repeatedly occurs. Thus, in the second case, the transistor repeats on and off and the voltage at the node N1 alternately changes to Vaa and VGH.

In both of the first case and the second case, the logic level corresponding to the voltage Va at the node N1 is the same as a logic level corresponding to a voltage applied to the node N1 using the transistor Q21 (a high level corresponding to the high-level power supply voltage VGH). Hence, the clocked inverter 14 provided at a subsequent stage to the node N1 performs the same operation as that performed when the transistor 17 is not provided. Thus, even when the high-level power supply voltage VGH is applied to the node N1, the transistor 17 does not affect the operation of the unit circuit 10.

When the supply of the high-level power supply voltage VGH is stopped, by which a transition from the power-on state to the power-off state (FIG. 7(c)) is made, the voltage at the gate terminal of the transistor 17 decreases to the ground voltage GND from the high-level power supply voltage VGH. When the voltage gets lower than a predetermined level, the transistor 17 is turned on and a current passing through the transistor 17 flows. Thus, the voltage at the node N1 changes to the ground voltage GND.

As such, the voltage at the node N1 is initialized to the ground voltage GND upon power off by the action of the transistor 17. Likewise, the voltage at the node N2 is initialized to the ground voltage GND upon power off by the action of the transistor 18.

Figure 8:
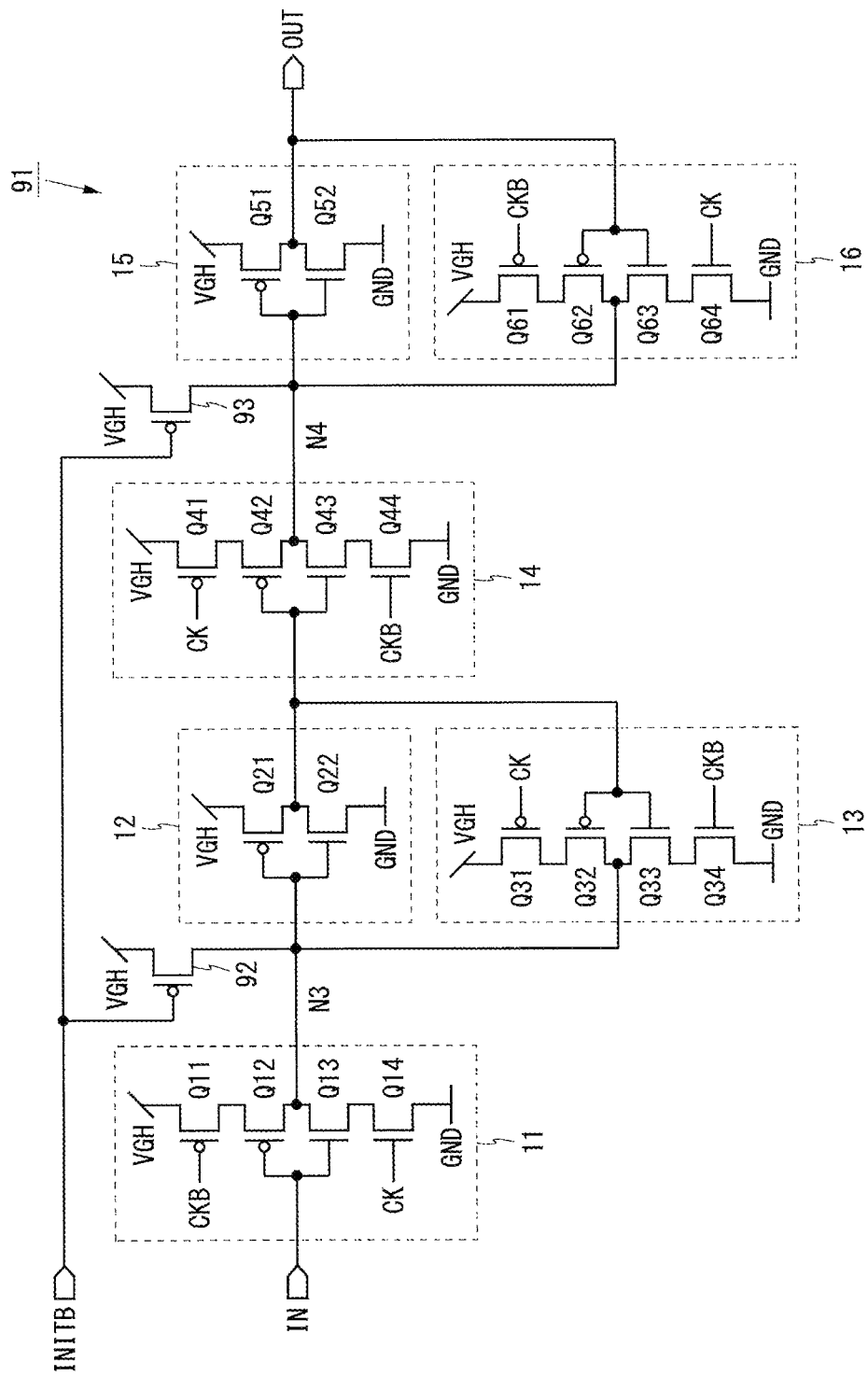
FIG. 8 is a circuit diagram of a unit circuit of a shift register according to a first comparative example.

FIG. 8 is a circuit diagram of a unit circuit of a shift register according to a first comparative example. A unit circuit 91 shown in FIG. 8 is obtained by adding P-channel enhancement mode transistors 92 and 93 to the unit circuit 90 shown in FIG. 20. Drain terminals of the transistors 92 and 93 are connected to nodes N3 and N4, respectively, which are connected to input terminals of inverters 12 and 15. A high-level power supply voltage VGH is applied to source terminals of the transistors 92 and 93. An initialization signal INITB is provided to gate terminals of the transistors 92 and 93. In the shift register according to the first comparative example, when initialization is performed, the initialization signal INITB is controlled to a low level. At this time, the transistors 92 and 93 are turned on and voltages at the nodes N3 and N4 are initialized to the high-level power supply voltage VGH.

Figure 9:
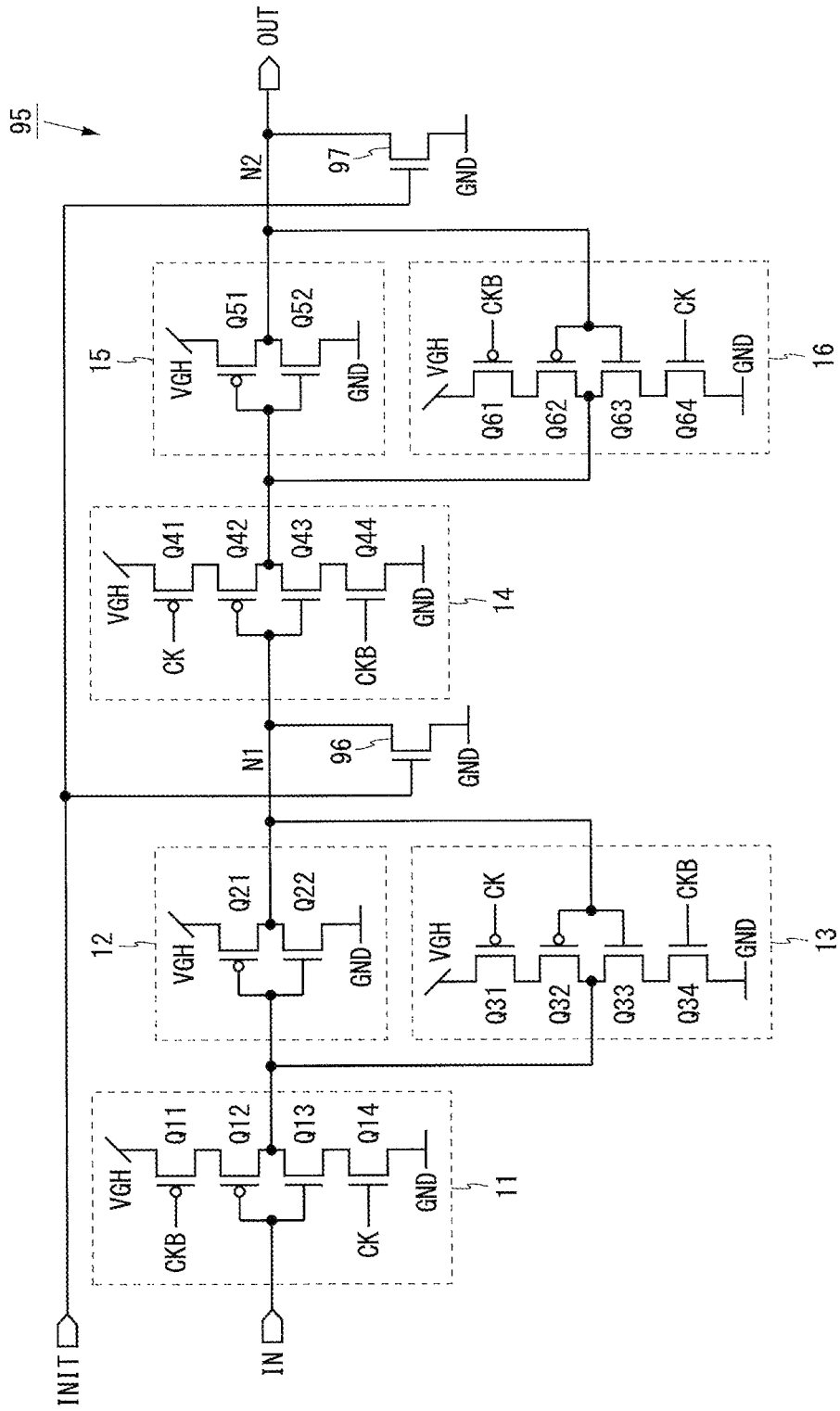
FIG. 9 is a circuit diagram of a unit circuit of a shift register according to a second comparative example.

FIG. 9 is a circuit diagram of a unit circuit of a shift register according to a second comparative example. A unit circuit 95 shown in FIG. 9 is obtained by adding N-channel enhancement mode transistors 96 and 97 to the unit circuit 90 shown in FIG. 20. Drain terminals of the transistors 96 and 97 are connected to nodes N1 and N2, respectively. A ground voltage GND is applied to source terminals of the transistors 96 and 97. An initialization signal INIT is provided to gate terminals of the transistors 96 and 97. In the shift register according to the second comparative example, when initialization is performed, the initialization signal INIT is controlled to a high level. At this time, the transistors 96 and 97 are turned on and voltages at the nodes N1 and N2 are initialized to the ground voltage GND.

In the shift registers according to the first and second comparative examples, when the internal nodes in the unit circuit are initialized, the initialization signal is used. Hence, initialization wiring lines through which the initialization signal propagates are provided, and after power on, an initialization voltage is applied to the initialization wiring lines before a display device starts operation. As a result, the shift registers according to the first and second comparative examples have the following problems: an input terminal for the initialization signal needs to be provided on an organic EL panel; the organic EL panel increases in size for the initialization wiring lines; and initialization needs to be performed taking a predetermined amount of time after power on.

On the other hand, in the shift register 1 according to the present embodiment, in a power-on state, a logic level corresponding to a voltage at the node N1 is the same as a logic level corresponding to a voltage applied to the node N1 using the transistor Q21 or Q22. In addition, in the power-on state, a logic level corresponding to a voltage at the node N2 is the same as a logic level corresponding to a voltage applied to the node N2 using the transistor Q51 or Q52. Hence, the transistors 17 and 18 do not affect the operation of the unit circuit 10. In a power-off state, since the transistors 17 and 18 are turned on, the ground voltage GND is provided to the nodes N1 and N2 by the action of the transistors 17 and 18. Thus, without using an initialization signal, the internal nodes (nodes N1 and N2) in the unit circuit 10 can be initialized upon power off. Therefore, an input terminal for an initialization signal does not need to be provided on the organic EL panel 51, the organic EL panel 51 does not increase in size for initialization wiring lines, and initialization can be automatically performed upon power off. Thus, the internal nodes in the unit circuit 10 of the shift register 1 can be easily initialized upon power off.

As described above, the shift register 1 according to the present embodiment has a configuration in which a plurality of unit circuits 10 are connected to each other in multiple stages. The unit circuits 10 each include a plurality of control transistors (transistors Q11 to Q14, Q21, Q22, Q31 to Q34, Q41 to Q44, Q51, Q52, and Q61 to Q64); internal nodes (nodes N1 and N2) connected to terminals of control transistors; and P-channel depletion mode initialization transistors (transistors 17 and 18) each having a first conduction terminal (source terminal) which is directly connected to one of the internal nodes, a second conduction terminal (drain terminal), and a control terminal (gate terminal). A ground voltage GND is applied to the second conduction terminal of the initialization transistor, and a power supply voltage (high-level power supply voltage VGH) is applied to the control terminal of the initialization transistor. The initialization transistor is turned on in a power-off state. Thus, according to the shift register 1, the internal nodes in the unit circuit 10 can be easily initialized upon power off.

In addition, in a power-on state, a logic level corresponding to a voltage at each internal node is the same as a logic level corresponding to a voltage applied to the internal node using a control transistor (Q21, Q22, Q51, or Q52). Thus, in the power-on state, the initialization transistors do not affect the operation of the unit circuit 10. In addition, the unit circuit 10 includes two or more initialization transistors. Thus, the plurality of internal nodes included in the unit circuit 10 can be easily initialized upon power off. In addition, the plurality of control transistors include both P-channel transistors and N-channel transistors. Thus, a shift register configured using both P-channel transistors and N-channel transistors can bring about the above-described effects.

The above-described display device (organic EL display device 50) includes a display panel (organic EL panel 51) including the plurality of scanning lines G1 to Gm, the plurality of data lines S1 to Sn, the plurality of light-emission control lines E1 to Em, and the plurality of pixel circuits 56; the scanning line drive circuit 53 that drives the scanning lines G1 to Gm; the data line drive circuit 54 that drives the data lines S1 to Sn; and the light-emission control line drive circuit 55 that drives the light-emission control lines E1 to Em. The scanning line drive circuit 53 is the above-described shift register 1. The light-emission control line drive circuit 55 has the same configuration as the shift register 1. According to such a display device, by easily initializing the internal nodes in the unit circuits 10 of the shift register 1 upon power off, erroneous operation of the scanning line drive circuit 53 and the light-emission control line drive circuit 55 after power on is prevented, and an image can be normally displayed after power on.

In addition, each pixel circuit 56 includes an electrooptic element (organic EL element 57) that emits light at luminance determined based on a current. The display panel is the organic EL panel 51. Thus, an organic EL display device including the organic EL panel 51 can bring about the above-described effects.

Second Embodiment

A shift register according to a second embodiment has the same configuration as the shift register 1 according to the first embodiment, and is used in the same manner as the shift register 1 (see FIGS. 1 and 2). Differences from the first embodiment will be described below.

Figure 10:
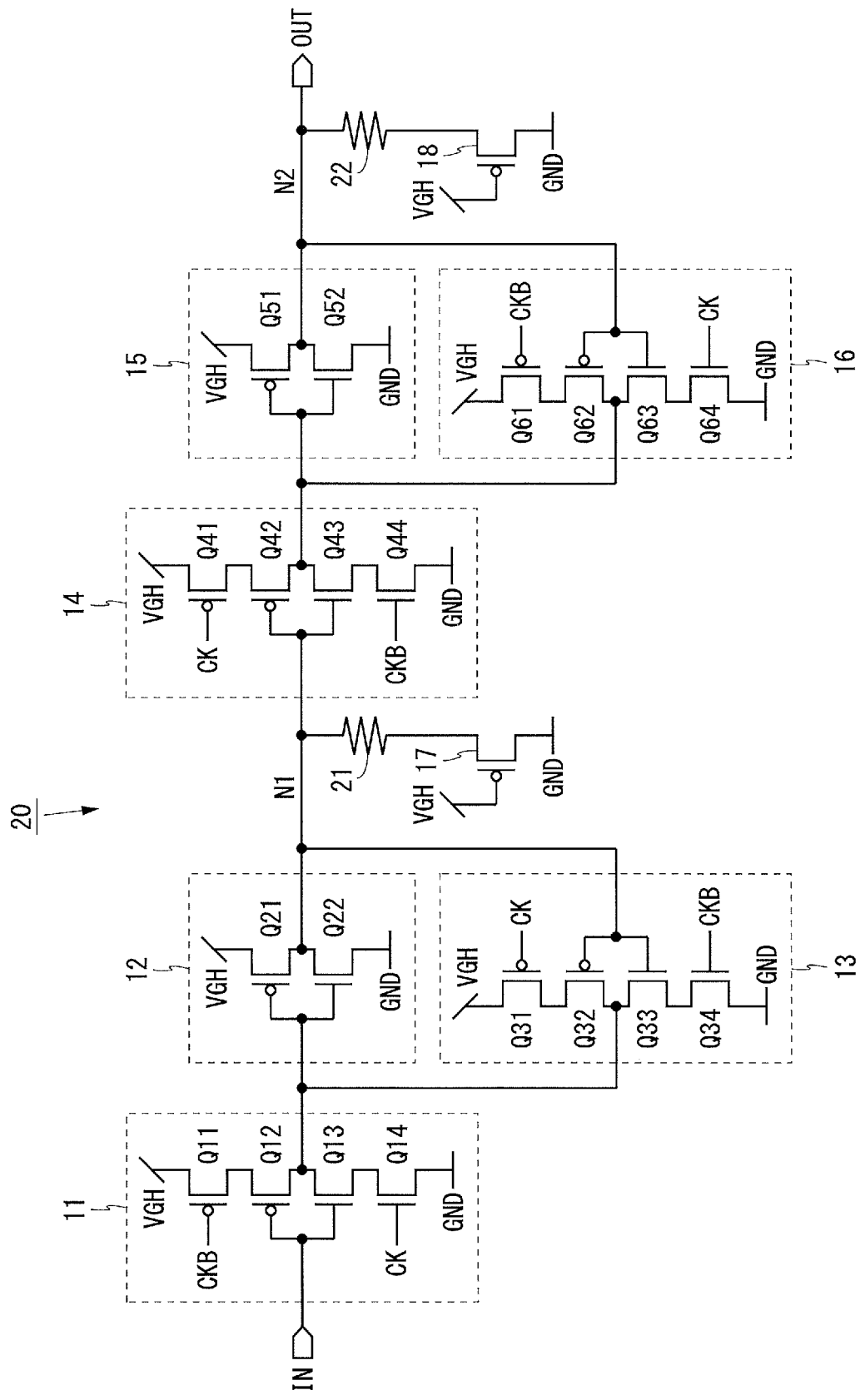
FIG. 10 is a circuit diagram of a unit circuit of a shift register according to a second embodiment.

FIG. 10 is a circuit diagram of a unit circuit of the shift register according to the present embodiment. A unit circuit 20 shown in FIG. 10 includes four clocked inverters 11, 13, 14, and 16, two inverters 12 and 15, two transistors 17 and 18, and two resistors 21 and 22. The unit circuit 20 is obtained by adding the transistors 17 and 18 and the resistors 21 and 22 to the unit circuit 90 shown in FIG. 20.

An upper-side terminal of each of the resistors 21 and 22 is hereinafter referred to as first terminal, and a lower-side terminal is hereinafter referred to as second terminal. The first terminals of the resistors 21 and 22 are connected to nodes N1 and N2, respectively. Source terminals (first conduction terminals) of the transistors 17 and 18 are connected to the second terminals of the resistors 21 and 22, respectively. In the unit circuit 20, the first conduction terminals of the transistors 17 and 18 are connected to the nodes N1 and N2 through the resistors 21 and 22, respectively.

Figure 11:
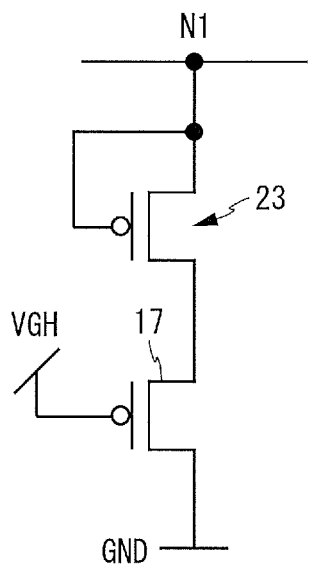
FIG. 11 is a diagram illustrating an exemplary configuration of a resistor included in the unit circuit shown in FIG. 10.

The resistors 21 and 22 are formed using, for example, a semiconductor layer (including an intrinsic semiconductor and a conductor region) of a transistor, indium tin oxide (ITO), indium zinc oxide (IZO), or a metal layer. To form a large resistance value of the resistors 21 and 22, it is preferred to form the resistors 21 and 22 using a conductor region of a semiconductor layer of a transistor. Particularly, when a material is an intrinsic semiconductor, it is preferred to use, as the resistors 21 and 22, a P-channel depletion mode transistor 23 in which as shown in FIG. 11, a gate terminal (control terminal) is short-circuited to a source terminal (a conduction terminal connected to the node N1).

As will be described later, in a power-on state, the transistors 17 and 18 do not affect the operation of the unit circuit 20. Thus, in the power-on state, the unit circuit 20 performs the same operation as the unit circuit 90 shown in FIG. 20. The shift register according to the present embodiment operates in accordance with the timing chart shown in FIG. 5 as with the shift register 1 according to the first embodiment.

Figure 12:
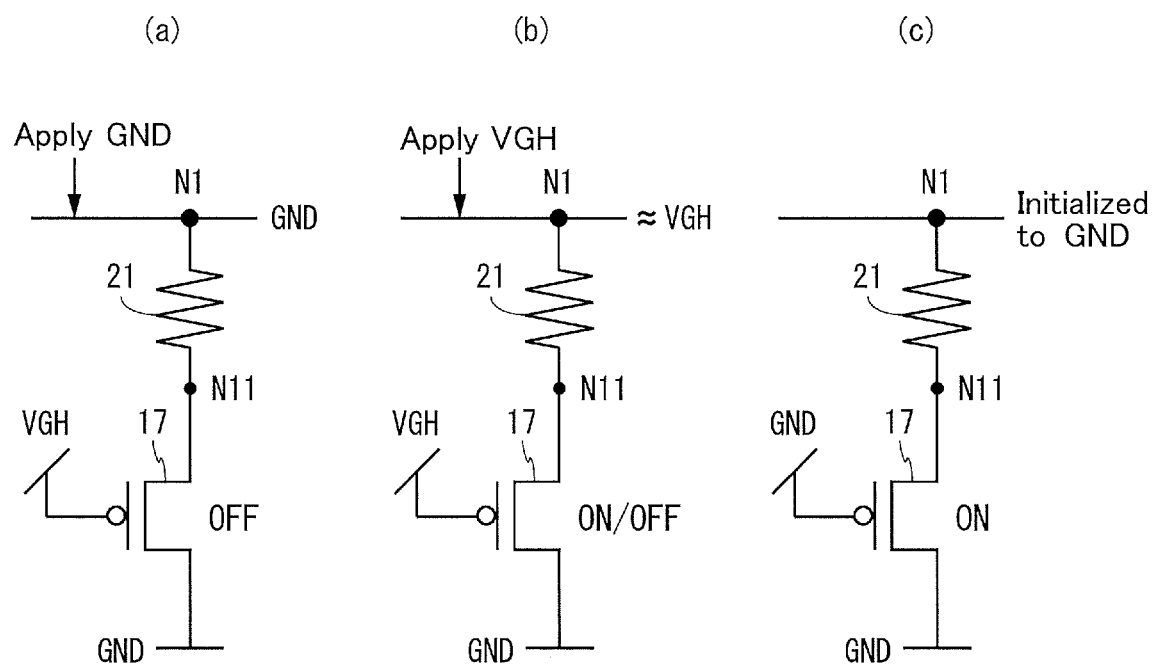
FIG. 12 is a diagram for describing a method for initializing an internal node in the unit circuit shown in FIG. 10.

FIG. 12 is a diagram for describing a method for initializing an internal node in the unit circuit 20. Here, a method for initializing a voltage at the node N1 using the transistor 17 will be described. A node connected to the second terminal of the resistor 21 and the source terminal of the transistor 17 is hereinafter referred to as N11, and a voltage at the node N11 is Vn11.

When a ground voltage GND is applied to the node N1 in a power-on state (FIG. 12(*a*)), the transistor 17 is turned off and the voltage at the node N1 is the ground voltage GND. At this time, a logic level (low level) corresponding to the voltage at the node N1 is the same as a logic level corresponding to a voltage applied to the node N1 using the transistor Q22. Thus, at this time, the transistor 17 does not affect the operation of the unit circuit 20.

A situation in which a high-level power supply voltage VGH is applied to the node N1 in the power-on state (FIG. 12(*b*)) is considered. Assuming that the transistor 17 is in an off state at this time, since a current passing through the transistor 17 does not flow between the node N1 and the ground, the voltages at the nodes N1 and N11 are both the high-level power supply voltage VGH. Since the gate-source voltage of the depletion mode transistor 17 is 0 V, the transistor 17 is turned on and a current passing through the transistor 17 flows. At this time, the voltage at the node N11 is lower than the voltage at the node N1 by an amount corresponding to a voltage drop at the resistor 21. When the voltage at the node N11 gets lower than a predetermined level, the transistor 17 is turned off. Hence, a current passing through the transistor 17 does not flow, and the voltages at the nodes N1 and N11 both go back to the high-level power supply voltage VGH.

Thus, when the high-level power supply voltage VGH is applied to the node N1 in the power-on state, the transistor 17 repeats on and off. The transistor 17 is turned on while Vn11≥VGH−Vthp and turned off while Vn11<VGH−Vthp. At this time, the voltage Vn11 fluctuates, but the voltage at the node N1 is substantially equal to the high-level power supply voltage VGH. At this time, a logic level (high level) corresponding to the voltage at the node N1 is the same as a logic level corresponding to a voltage applied to the node N1 using the transistor Q21. Hence, the clocked inverter 14 provided at a subsequent stage to the node N1 performs the same operation as that performed when the transistor 17 is not provided. Thus, even when the high-level power supply voltage VGH is applied to the node N1, the transistor 17 does not affect the operation of the unit circuit 20.

The difference between the high-level power supply voltage VGH and the voltage at the node N1 for when the high-level power supply voltage VGH is applied to the node N1 decreases as the absolute value of a threshold voltage of the transistor 17 decreases. Hence, in the unit circuit 20, it is preferred that the absolute value of the threshold voltage of the transistor 17 be between 0 V and 1 V, inclusive.

When the supply of the high-level power supply voltage VGH is stopped, by which a transition from the power-on state to a power-off state (FIG. 12(*c*)) is made, the voltage at the gate terminal of the transistor 17 decreases to the ground voltage GND from the high-level power supply voltage VGH. When the voltage gets lower than a predetermined level, the transistor 17 is turned on and a current passing through the transistor 17 flows. Thus, the voltage at the node N1 changes to the ground voltage GND.

As such, the voltage at the node N1 is initialized to the ground voltage GND upon power off by the action of the transistor 17. Likewise, the voltage at the node N2 is initialized to the ground voltage GND upon power off by the action of the transistor 18.

As described above, in the shift register according to the present embodiment, the unit circuit 20 includes P-channel depletion mode initialization transistors (transistors 17 and 18) each having a first conduction terminal (source terminal) which is connected to an internal node (node N1 or N2) through a resistor (resistor 21 or 22), a second conduction terminal (drain terminal), and a control terminal (gate terminal). The shift register according to the present embodiment, by including the resistors, enables the internal nodes in the unit circuit 20 to be easily initialized upon power off while reducing changes in voltages at the internal nodes in a power-on state.

Third Embodiment

A shift register according to a third embodiment has the same configuration as the shift register 1 according to the first embodiment, and is used in the same manner as the shift register 1 (see FIGS. 1 and 2). Differences from the first embodiment will be described below.

Figure 13:
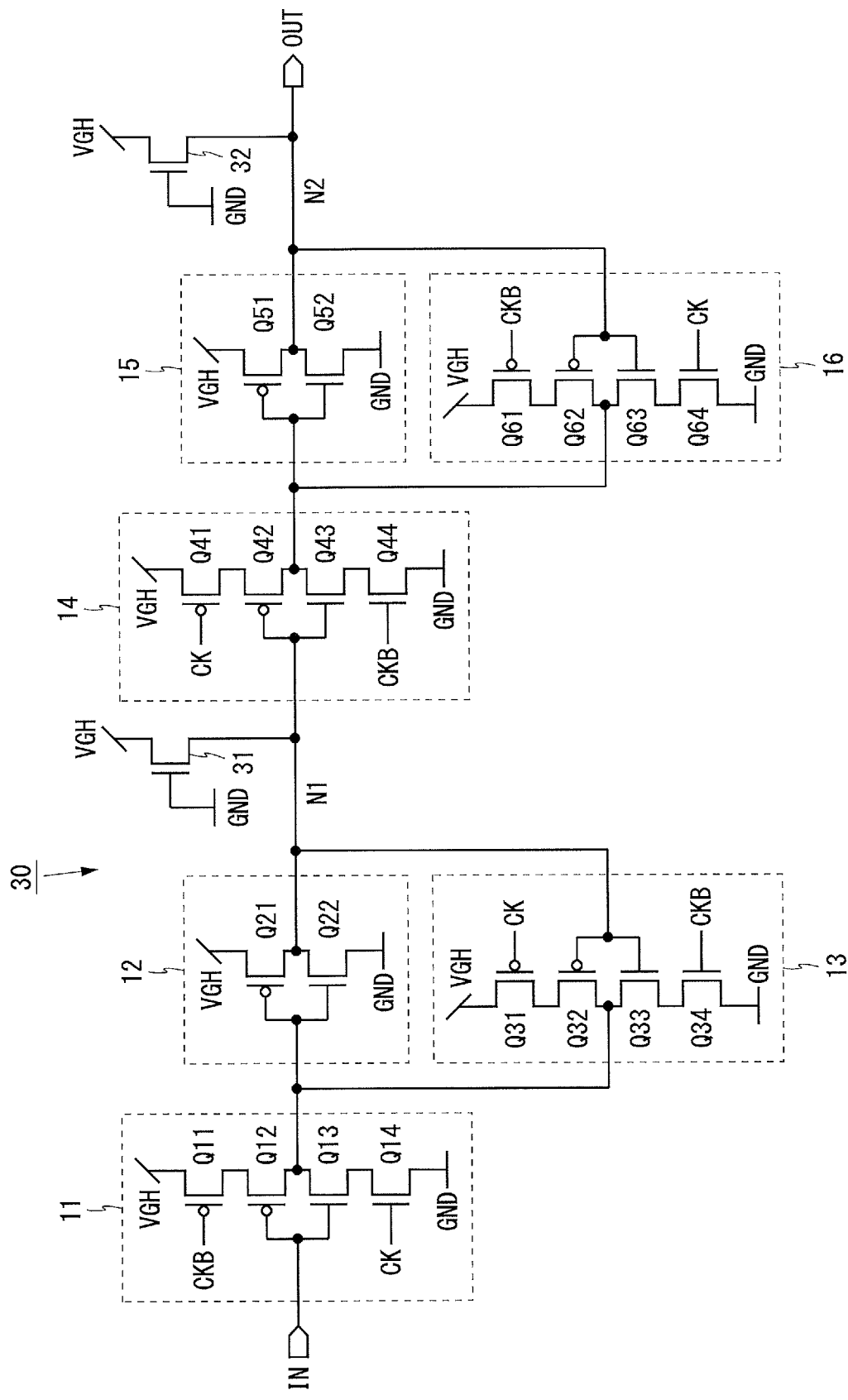
FIG. 13 is a circuit diagram of a unit circuit of a shift register according to a third embodiment.

FIG. 13 is a circuit diagram of a unit circuit of the shift register according to the present embodiment. A unit circuit 30 shown in FIG. 13 includes four clocked inverters 11, 13, 14, and 16, two inverters 12 and 15, and two transistors 31 and 32. The unit circuit 30 is obtained by adding the transistors 31 and 32 to the unit circuit 90 shown in FIG. 20.

The transistors 31 and 32 are N-channel depletion mode transistors and function as initialization transistors. Source terminals (first conduction terminals) of the transistors 31 and 32 are connected to nodes N1 and N2, respectively. A high-level power supply voltage VGH is applied to drain terminals (second conduction terminals) of the transistors 31 and 32. A ground voltage GND is applied to gate terminals (control terminals) of the transistors 31 and 32. In the unit circuit 30, the first conduction terminals of the transistors 31 and 32 are directly connected to the nodes N1 and N2, respectively.

As will be described later, in a power-on state, the transistors 31 and 32 do not affect the operation of the unit circuit 30. Thus, in the power-on state, the unit circuit 30 performs the same operation as the unit circuit 90 shown in FIG. 20. The shift register according to the present embodiment operates in accordance with the timing chart shown in FIG. 5 as with the shift register 1 according to the first embodiment.

Figure 14:
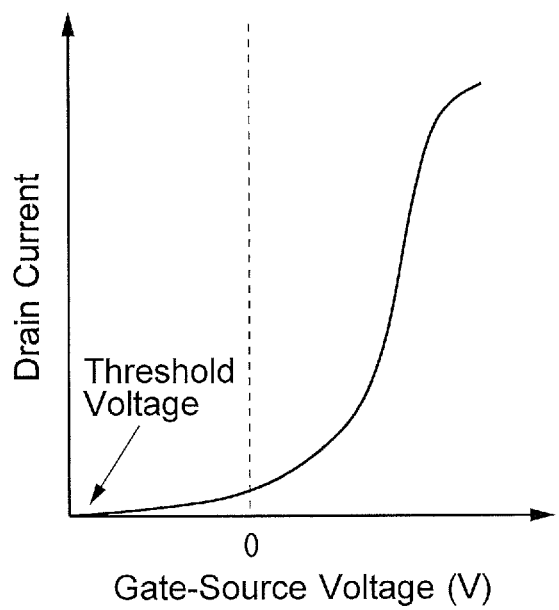
FIG. 14 is a characteristic diagram of an N-channel depletion mode transistor.

FIG. 14 is a characteristic diagram of an N-channel depletion mode transistor. As shown in FIG. 14, in the depletion mode transistor, when the gate-source voltage is 0 V, a drain current flows. The transistors 31 and 32 included in the unit circuit 30 have a characteristic shown in FIG. 14.

Figure 15:
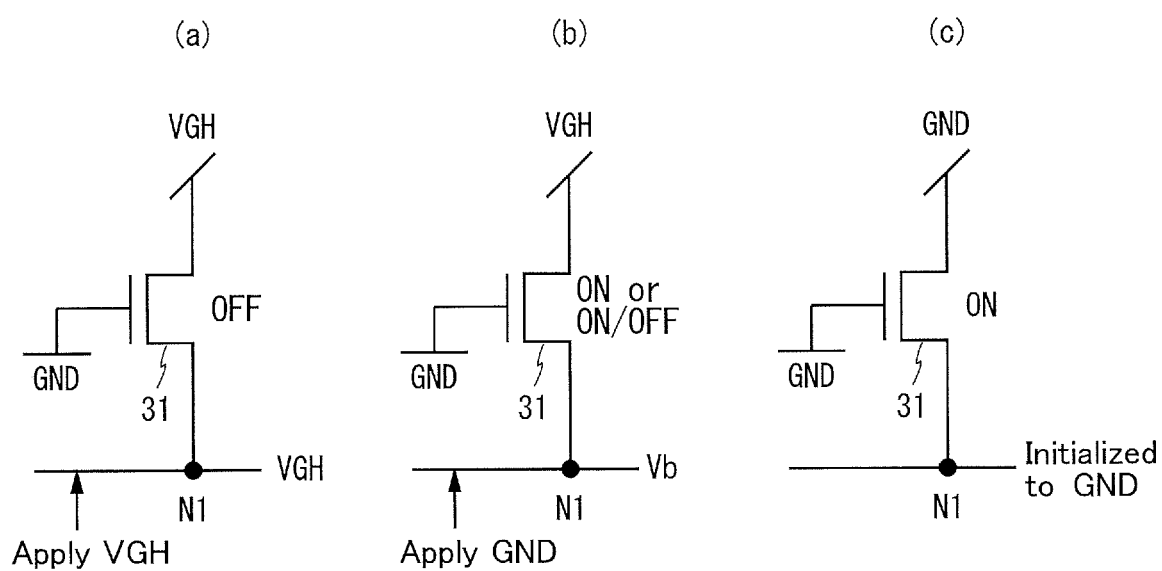
FIG. 15 is a diagram for describing a method for initializing an internal node in the unit circuit shown in FIG. 13.

FIG. 15 is a diagram for describing a method for initializing an internal node in the unit circuit 30. Here, a method for initializing a voltage at the node N1 using the transistor 31 will be described. FIG. 15(*a*) shows a state in which in a power-on state, the transistor Q21 (FIG. 3) is turned on and a high-level power supply voltage VGH is applied to the node N1. FIG. 15(*b*) shows a state in which in the power-on state, the transistor Q22 (FIG. 3) is turned on and a ground voltage GND is applied to the node N1. FIG. 15(c) shows a power-off state. In the power-on state, the high-level power supply voltage VGH is applied to the drain terminal (second conduction terminal) of the transistor 31. In the power-off state, the voltage at the drain terminal of the transistor 31 is the ground voltage GND.

When the high-level power supply voltage VGH is applied to the node N1 in the power-on state (FIG. 15(a)), the transistor 31 is turned off and the voltage at the node N1 is the high-level power supply voltage VGH. At this time, a logic level (high level) corresponding to the voltage at the node N1 is the same as a logic level corresponding to a voltage applied to the node N1 using the transistor Q21. Thus, at this time, the transistor 31 does not affect the operation of the unit circuit 30.

A situation in which the ground voltage GND is applied to the node N1 in the power-on state (FIG. 15(b)) is considered. Assuming that the transistor 31 is in an off state at this time, since a current passing through the transistor 31 does not flow between the node N1 and a high-level power line, the voltage at the node N1 is the ground voltage GND. Since the gate-source voltage of the depletion mode transistor 31 is 0 V, the transistor 31 is turned on and a current passing through the transistor 31 flows. At this time, the voltage at the node N1 is a voltage (hereinafter, referred to as Vb) determined based on the ratio of the on-resistance of the transistor Q22 to the on-resistance of the transistor 31. The unit circuit 30 is designed such that a logic level corresponding to the voltage Vb is a low level. Hence, the unit circuit 30 is designed, for example, such that the on-resistance of the transistor 31 is sufficiently larger than the on-resistance of the transistor Q22.

When the threshold voltage of the transistor 31 is Vthn (<0), there are a case in which Vb≤−Vthn and a case in which Vb>−Vthn (the former is hereinafter referred to as third case and the latter is hereinafter referred to as fourth case). In the third case, even after the voltage at the node N1 is changed to Vb, the transistor 31 maintains the on state, and a current passing through the transistor 31 continues to flow. Thus, in the third case, the voltage at the node N1 does not change from Vb. In the fourth case, when the voltage at the node N1 is changed to a voltage Vbb which is above −Vthn, the transistor 31 is turned off and the voltage at the node N1 goes back to the ground voltage GND. Hence, the transistor 31 is turned back on and the voltage at the node N1 goes back to Vbb. Thereafter, too, the same situation repeatedly occurs. Thus, in the fourth case, the transistor 31 repeats on and off and the voltage at the node N1 alternately changes to Vbb and GND.

In both of the third case and the fourth case, the logic level corresponding to the voltage Vb at the node N1 is the same as a logic level corresponding to a voltage applied to the node N1 using the transistor Q22 (a low level corresponding to the ground voltage GND). Hence, the clocked inverter 14 provided at a subsequent stage to the node N1 performs the same operation as that performed when the transistor 31 is not provided. Thus, even when the ground voltage GND is applied to the node N1, the transistor 31 does not affect the operation of the unit circuit 30.

When the supply of the high-level power supply voltage VGH is stopped, by which a transition from the power-on state to the power-off state (FIG. 15(c)) is made, the voltage at the drain terminal (second conduction terminal) of the transistor 31 decreases to the ground voltage GND from the high-level power supply voltage VGH. When the voltage gets lower than a predetermined level, the transistor 31 is turned on and a current passing through the transistor 31 flows. Thus, the voltage at the node N1 changes to the ground voltage GND.

As such, the voltage at the node N1 is initialized to the ground voltage GND upon power off by the action of the transistor 31. Likewise, the voltage at the node N2 is initialized to the ground voltage GND upon power off by the action of the transistor 32.

As described above, in the shift register according to the present embodiment, the unit circuit 30 includes N-channel depletion mode initialization transistors (transistors 31 and 32) each having a first conduction terminal (source terminal) which is directly connected to an internal node (node N1 or N2), a second conduction terminal (drain terminal), and a control terminal (gate terminal). A power supply voltage (high-level power supply voltage VGH) is applied to the second conduction terminal of the initialization transistor, and the ground voltage GND is applied to the control terminal of the initialization transistor. The initialization transistor is turned on in a power-off state. Thus, the shift register according to the present embodiment enables the internal nodes in the unit circuit 30 to be easily initialized upon power off.

In addition, in a power-on state, a logic level corresponding to a voltage at each internal node is the same as a logic level corresponding to a voltage applied to the internal node using a control transistor (Q21, Q22, Q51, or Q52). Thus, in the power-on state, the initialization transistor does not affect the operation of the unit circuit 30.

Fourth Embodiment

A shift register according to a fourth embodiment has the same configuration as the shift register 1 according to the first embodiment, and is used in the same manner as the shift register 1 (see FIGS. 1 and 2). Differences from the first embodiment will be described below.

Figure 16:
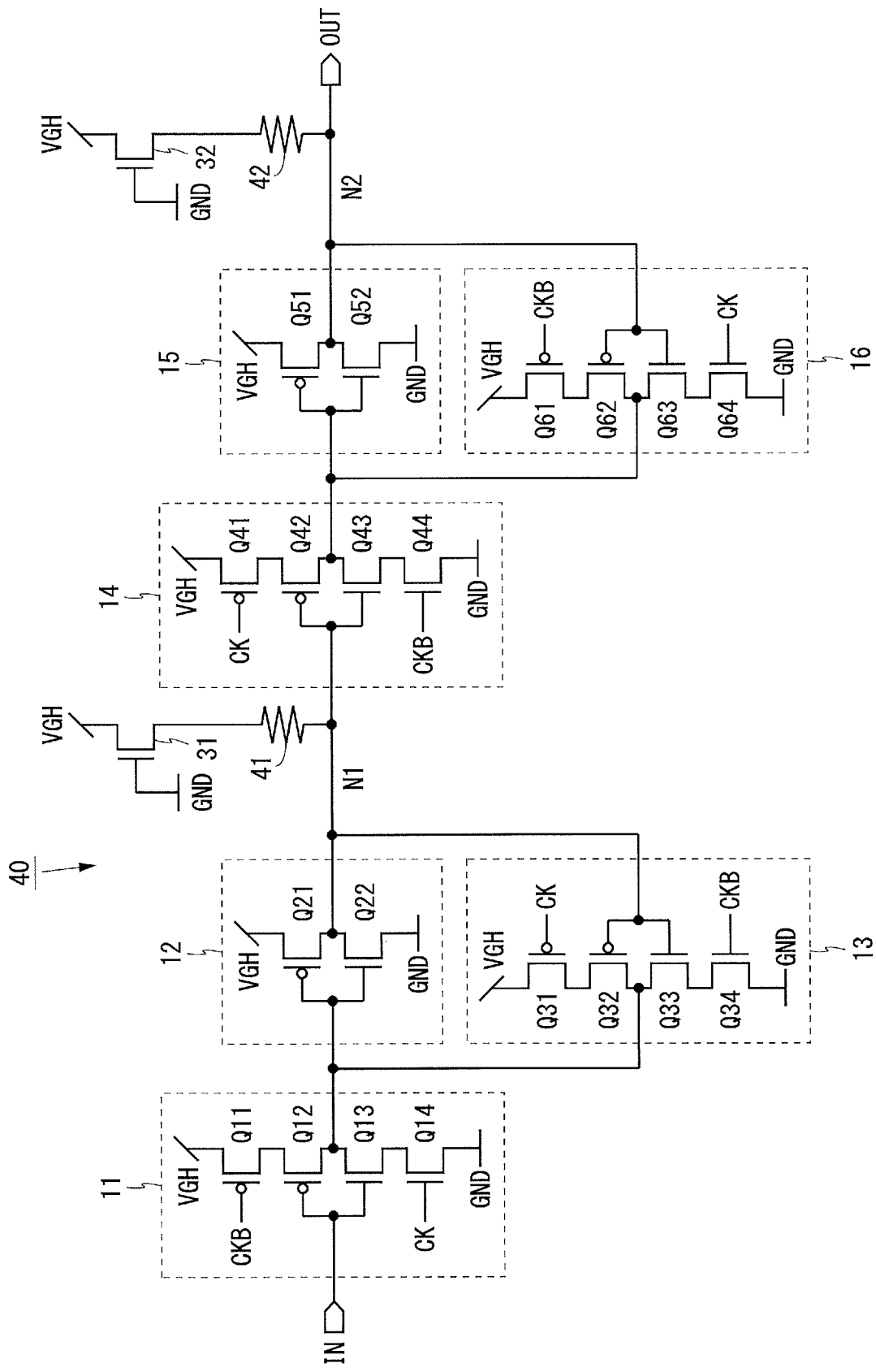
FIG. 16 is a circuit diagram of a unit circuit of a shift register according to a fourth embodiment.

FIG. 16 is a circuit diagram of a unit circuit of the shift register according to the present embodiment. A unit circuit 40 shown in FIG. 16 includes four clocked inverters 11, 13, 14, and 16, two inverters 12 and 15, two transistors 31 and 32, and two resistors 41 and 42. The unit circuit 40 is obtained by adding the transistors 31 and 32 and the resistors 41 and 42 to the unit circuit 90 shown in FIG. 20.

A lower-side terminal of each of the resistors 41 and 42 is hereinafter referred to as first terminal, and an upper-side terminal is hereinafter referred to as second terminal. The first terminals of the resistors 41 and 42 are connected to nodes N1 and N2, respectively. Source terminals (first conduction terminals) of the transistors 31 and 32 are connected to the second terminals of the resistors 41 and 42, respectively. In the unit circuit 40, the first conduction terminals of the transistors 31 and 32 are connected to the nodes N1 and N2 through the resistors 41 and 42, respectively.

The resistors 41 and 42 are formed by the same method as the resistors 21 and 22 according to the second embodiment. To form large resistance values of the resistors 41 and 42, it is preferred to form the resistors 41 and 42 using a conductor region of a semiconductor layer of a transistor. Particularly, when a material is an intrinsic semiconductor, it is preferred to use, as the resistors 41 and 42, an N-channel depletion mode transistor 43 in which as shown in FIG. 17, a gate terminal (control terminal) is short-circuited to a source terminal (a conduction terminal connected to the node N1).

As will be described later, in a power-on state, the transistors 31 and 32 do not affect the operation of the unit circuit 40. Thus, in the power-on state, the unit circuit 40 performs the same operation as the unit circuit 90 shown in FIG. 20. The shift register according to the present embodiment operates in accordance with the timing chart shown in FIG. 5 as with the shift register 1 according to the first embodiment.

FIG. 18 is a diagram for describing a method for initializing an internal node in the unit circuit 40. Here, a method for initializing a voltage at the node N1 using the transistor 31 will be described. A node connected to the second terminal of the resistor 41 and the source terminal of the transistor 31 is hereinafter referred to as N12, and a voltage at the node N12 is Vn12.

When a high-level power supply voltage VGH is applied to the node N1 in a power-on state (FIG. 18(*a*)), the transistor 31 is turned off and the voltage at the node N1 is the high-level power supply voltage VGH. At this time, a logic level (high level) corresponding to the voltage at the node N1 is the same as a logic level corresponding to a voltage applied to the node N1 using the transistor Q21. Thus, at this time, the transistor 31 does not affect the operation of the unit circuit 40.

A situation in which a ground voltage GND is applied to the node N1 in the power-on state (FIG. 18(*b*)) is considered. Assuming that the transistor 31 is in an off state at this time, since a current passing through the transistor 31 does not flow between the node N1 and a high-level power line, the voltages at the nodes N1 and N12 are both the ground voltage GND. Since the gate-source voltage of the depletion mode transistor 31 is 0 V, the transistor 31 is turned on and a current passing through the transistor 31 flows. At this time, the voltage at the node N12 is higher than the voltage at the node N1 by an amount corresponding to a voltage drop at the resistor 41. When the voltage at the node N12 gets higher than a predetermined level, the transistor 31 is turned off. Hence, a current passing through the transistor 31 does not flow, and the voltages at the nodes N1 and N12 both go back to the ground voltage GND.

Thus, when the ground voltage GND is applied to the node N1 in the power-on state, the transistor 31 repeats on and off. The transistor 31 is turned on while Vn12−Vthn and turned off while Vn12>−Vthn. At this time, the voltage Vn12 fluctuates, but the voltage at the node N1 is substantially equal to the ground voltage GND. At this time, the logic level (low level) corresponding to the voltage at the node N1 is the same as a logic level corresponding to a voltage applied to the node N1 using the transistor Q22. Hence, the clocked inverter 14 provided at a subsequent stage to the node N1 performs the same operation as that performed when the transistor 31 is not provided. Thus, even when the ground voltage GND is applied to the node N1, the transistor 31 does not affect the operation of the unit circuit 10. The same can also be said for the transistor 32. In the unit circuit 40, too, it is preferred that the absolute value of a threshold voltage of the transistor 31 be between 0 V and 1 V, inclusive.

When the supply of the high-level power supply voltage VGH is stopped, by which a transition from the power-on state to a power-off state (FIG. 18(*c*)) is made, the voltage at the drain terminal (second conduction terminal) of the transistor 31 decreases to the ground voltage GND from the high-level power supply voltage VGH. When the voltage gets lower than a predetermined level, the transistor 31 is turned on and a current passing through the transistor 31 flows. Thus, the voltage at the node N1 changes to the ground voltage GND.

As such, the voltage at the node N1 is initialized to the ground voltage GND upon power off by the action of the transistor 31. Likewise, the voltage at the node N2 is initialized to the ground voltage GND upon power off by the action of the transistor 32.

As described above, in the shift register according to the present embodiment, the unit circuit 40 includes N-channel depletion mode initialization transistors (transistors 31 and 32) each having a first conduction terminal (source terminal) which is connected to an internal node (node N1 or N2) through a resistor (resistor 41 or 42), a second conduction terminal (drain terminal), and a control terminal (gate terminal). The shift register according to the present embodiment, by including the resistors, enables the internal nodes in the unit circuit 40 to be easily initialized upon power off while reducing changes in voltages at the internal nodes in a power-on state.

Note that the unit circuits 10, 20, 30, and 40 of the shift registers according to the first to fourth embodiments may include a clocked inverter in which two P-channel transistors are connected in reverse order and two N-channel transistors are connected in reverse order. For example, the unit circuits 10, 20, 30, and 40 may include a clocked inverter 19 shown in FIG. 19, instead of the clocked inverter 11. In the clocked inverter 19, transistors Q11 and Q12 are connected in reverse order and transistors Q13 and Q14 are connected in reverse order, compared to the clocked inverter 11.

In a shift register according to a variant, a unit circuit may include one initialization transistor. This enables one internal node included in the unit circuit to be easily initialized upon power off. In addition, in a shift register according to a variant, a plurality of control transistors may be all P-channel transistors or N-channel transistors, and the conductive type of the initialization transistors may be the same as the conductive type of the control transistors. This enables a shift register configured using only P-channel transistors or N-channel transistors to bring about the above-described effects.

Although an organic EL display device provided with an organic EL panel including pixel circuits each including an organic EL element (organic light-emitting diode) has been described so far as an example of a display device including a shift register having a configuration in which a plurality of unit circuits each including depletion mode initialization transistors are connected to each other in multiple stages, a liquid crystal display device provided with a liquid crystal panel including pixel circuits each including a liquid crystal element, an inorganic EL display device provided with a display panel including pixel circuits each including an inorganic light-emitting diode, a quantum-dot light-emitting diode (QLED) display device provided with a display panel including pixel circuits each including a quantum-dot light-emitting diode, etc., may be formed in the same manner as that described above.

DESCRIPTION OF REFERENCE CHARACTERS

1: SHIFT REGISTER
10, 20, 30, and 40: UNIT CIRCUIT
11, 13, 14, 16, and 19: CLOCKED INVERTER
12 and 15: INVERTER
17, 18, 23, 31, 32, and 43: TRANSISTOR
21, 22, 41, and 42: RESISTOR 50: ORGANIC EL DISPLAY DEVICE
51: ORGANIC EL PANEL
52: DISPLAY CONTROL CIRCUIT
53: SCANNING LINE DRIVE CIRCUIT
54: DATA LINE DRIVE CIRCUIT
55: LIGHT-EMISSION CONTROL LINE DRIVE CIRCUIT
56: PIXEL CIRCUIT
57: ORGANIC EL ELEMENT

The invention claimed is:

1. A shift register having a configuration in which a plurality of unit circuits are connected to each other in multiple stages, wherein
the plurality of unit circuits each include:
a plurality of control transistors;
an internal node connected to a terminal of one of the plurality of control transistors; and
a depletion mode initialization transistor having a first conduction terminal connected directly or through a resistor to the internal node, a second conduction terminal, and a control terminal,
one of a power supply voltage and a ground voltage is applied to the second conduction terminal,
another one of the power supply voltage and the ground voltage is applied to the control terminal, and
the initialization transistor is turned on in a power-off state.

2. The shift register according to claim 1, wherein
the initialization transistor is a P-channel transistor,
the ground voltage is applied to the second conduction terminal, and
the power supply voltage is applied to the control terminal.

3. The shift register according to claim 1, wherein
the initialization transistor is an N-channel transistor,
the power supply voltage is applied to the second conduction terminal, and
the ground voltage is applied to the control terminal.

4. The shift register according to claim 1, wherein in a power-on state, a logic level corresponding to a voltage at the internal node is same as a logic level corresponding to a voltage applied to the internal node using the one of the plurality of control transistors.

5. The shift register according to claim 1, wherein the unit circuit includes one initialization transistor.

6. The shift register according to claim 1, wherein the unit circuit includes two or more initialization transistors.

7. The shift register according to claim 1, wherein the plurality of control transistors include both a P-channel transistor and an N-channel transistor.

8. The shift register according to claim 1, wherein
the plurality of control transistors are either all P-channel transistors or all N-channel transistors, and
a conductive type of the initialization transistor is same as a conductive type of the plurality of control transistors.

9. The shift register according to claim 1, wherein
the first conduction terminal is connected to the internal node through the resistor, and
the resistor is a transistor in which a control terminal is short-circuited to a conduction terminal connected to the internal node.

10. The shift register according to claim 1, wherein
the first conduction terminal is connected to the internal node through the resistor, and
an absolute value of a threshold voltage of the initialization transistor is between 0 V and 1 V, inclusive.

11. A display device comprising:
a display panel including a plurality of scanning lines, a plurality of data lines, and a plurality of pixel circuits;
a scanning line drive circuit configured to drive the plurality of scanning lines;
a data line drive circuit configured to drive the plurality of data lines; and
the shift register according to claim 1.

12. The display device according to claim 11, wherein the scanning line drive circuit is the shift register.

13. The display device according to claim 11, wherein
the display panel further includes a plurality of light-emission control lines,
the display device further comprises a light-emission control line drive circuit configured to drive the plurality of light-emission control lines, and
the light-emission control line drive circuit is the shift register.

14. The display device according to claim 11, wherein the plurality of pixel circuits each include an electrooptic element configured to emit light at luminance determined based on a current.

15. The display device according to claim 14, wherein the display panel is an organic electroluminescence panel.

16. The display device according to claim 11, wherein the display panel is a liquid crystal panel.

17. A method for controlling a shift register having a configuration in which a plurality of unit circuits are connected to each other in multiple stages, the plurality of unit circuits each including a plurality of control transistors, an internal node connected to a terminal of one of the plurality of control transistors, and a depletion mode initialization transistor having a first conduction terminal connected directly or through a resistor to the internal node, a second conduction terminal, and a control terminal, the method comprising:
allowing the shift register to operate by applying one of a power supply voltage and a ground voltage to the second conduction terminal, and applying another one of the power supply voltage and the ground voltage to the control terminal; and
bringing the initialization transistor into an on state by stopping supply of the power supply voltage.

18. The method for controlling a shift register according to claim 17, wherein
the initialization transistor is a P-channel transistor, and
in allowing the shift register to operate, the ground voltage is applied to the second conduction terminal, and the power supply voltage is applied to the control terminal.

19. The method for controlling a shift register according to claim 17, wherein
the initialization transistor is an N-channel transistor, and
in allowing the shift register to operate, the power supply voltage is applied to the second conduction terminal, and the ground voltage is applied to the control terminal.

20. The method for controlling a shift register according to claim 17, wherein in a power-on state, a logic level corresponding to a voltage at the internal node is same as a logic level corresponding to a voltage applied to the internal node using the one of the plurality of control transistors.

* * * * *